United States Patent
Chang et al.

(10) Patent No.: US 12,056,432 B2
(45) Date of Patent: *Aug. 6, 2024

(54) PIN MODIFICATION FOR STANDARD CELLS

(71) Applicant: Taiwan Semiconductor Manufacturing Co., Ltd., Hsinchu (TW)

(72) Inventors: Fong-yuan Chang, Hsinchu (TW); Chun-Chen Chen, Hsinchu County (TW); Sheng-Hsiung Chen, Hsinchu County (TW); Ting-Wei Chiang, New Taipei (TW); Chung-Te Lin, Tainan (TW); Jung-Chan Yang, Taoyuan County (TW); Lee-Chung Lu, Taipei (TW); Po-Hsiang Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/300,142

(22) Filed: Apr. 13, 2023

(65) Prior Publication Data

US 2023/0253396 A1     Aug. 10, 2023

Related U.S. Application Data

(63) Continuation of application No. 17/315,900, filed on May 10, 2021, now Pat. No. 11,637,098, which is a
(Continued)

(51) Int. Cl.
*G06F 30/30* (2020.01)
*G06F 30/392* (2020.01)
(Continued)

(52) U.S. Cl.
CPC .......... *G06F 30/398* (2020.01); *G06F 30/392* (2020.01); *G06F 30/394* (2020.01);
(Continued)

(58) Field of Classification Search
CPC .......... H01L 27/0207; H01L 27/11807; H01L 2027/11875; G06F 30/394; G06F 30/392; G06F 30/398; H03K 19/17704
See application file for complete search history.

(56) References Cited

U.S. PATENT DOCUMENTS 6,906,942 B2 *   6/2005   Ostermayr ............. H10B 20/00
                                                257/E27.102
7,647,574 B2     1/2010   Haruki
(Continued)

FOREIGN PATENT DOCUMENTS

KR    1020130129450 A    11/2013
KR    1020170015070 A    2/2017
(Continued)

OTHER PUBLICATIONS

Office Action, dated Aug. 27, 2019, for Taiwan Intellectual Property Office Patent Appl. No. 107125268, 3 pages.
(Continued)

*Primary Examiner* — Jack Chiang
*Assistant Examiner* — Brandon Bowers
(74) *Attorney, Agent, or Firm* — Sterne, Kessler, Goldstein & Fox P.L.L.C.

(57) ABSTRACT

The present disclosure describes an example method for routing a standard cell with multiple pins. The method can include modifying a dimension of a pin of the standard cell, where the pin is spaced at an increased distance from a boundary of the standard cell than an original position of the pin. The method also includes routing an interconnect from the pin to a via placed on a pin track located between the pin
(Continued)

and the boundary and inserting a keep out area between the interconnect and a pin from an adjacent standard cell. The method further includes verifying that the keep out area separates the interconnect from the pin from the adjacent standard cell by at least a predetermined distance.

20 Claims, 9 Drawing Sheets

Related U.S. Application Data continuation of application No. 16/744,975, filed on Jan. 16, 2020, now Pat. No. 11,037,920, which is a continuation of application No. 15/966,507, filed on Apr. 30, 2018, now Pat. No. 10,559,558.

(60) Provisional application No. 62/565,262, filed on Sep. 29, 2017.

(51) Int. Cl.
*G06F 30/394* (2020.01)
*G06F 30/398* (2020.01)
*H01L 27/02* (2006.01)
*H01L 27/118* (2006.01)

(52) U.S. Cl.
CPC .... *H01L 27/0207* (2013.01); *H01L 27/11807* (2013.01); *H01L 2027/11875* (2013.01)

(56) References Cited

U.S. PATENT DOCUMENTS

| | | | |
|---|---|---|---|
| 7,907,002 B2 | 3/2011 | Bracmard et al. | |
| 7,919,792 B2 | 4/2011 | Law et al. | |
| 7,956,421 B2 | 6/2011 | Becker | |
| 8,136,072 B2 | 3/2012 | Frederick | |
| 8,237,203 B2 | 8/2012 | Tsuda et al. | |
| 8,661,392 B2 | 2/2014 | Quandt et al. | |
| 9,122,830 B2 | 9/2015 | Yuan et al. | |
| 9,563,731 B2 | 2/2017 | Hsu et al. | |
| 9,826,632 B2 | 11/2017 | Chang et al. | |
| 9,892,224 B2 * | 2/2018 | Lin | G06F 30/39 |
| 9,977,854 B2 | 5/2018 | Rowhani et al. | |
| 10,037,920 B2 | 7/2018 | Tsai et al. | |
| 10,083,269 B2 | 9/2018 | De Dood et al. | |
| 10,169,515 B2 * | 1/2019 | Sio | G06F 30/398 |
| 10,192,859 B2 | 1/2019 | Aton et al. | |
| 10,262,981 B2 | 4/2019 | Chang et al. | |
| 10,268,796 B2 | 4/2019 | Chang et al. | |
| 10,559,558 B2 | 2/2020 | Chang et al. | |
| 11,637,098 B2 * | 4/2023 | Chang | H01L 27/11807 |
| | | | 716/122 |
| 2010/0155783 A1 * | 6/2010 | Law | H01L 27/0207 |
| | | | 257/206 |
| 2012/0241986 A1 | 9/2012 | Sherlekar et al. | |
| 2012/0249182 A1 | 10/2012 | Sherlekar | |
| 2014/0040847 A1 | 2/2014 | Milinichik et al. | |
| 2014/0137060 A1 | 5/2014 | Liu et al. | |
| 2014/0282289 A1 * | 9/2014 | Hsu | G03F 7/70433 |
| | | | 716/51 |
| 2017/0032073 A1 | 2/2017 | Chen et al. | |
| 2017/0140086 A1 * | 5/2017 | Sio | H01L 21/027 |
| 2019/0035811 A1 * | 1/2019 | Chang | H01L 27/11807 |
| 2019/0095573 A1 * | 3/2019 | Huang | G06F 30/394 |
| 2019/0096872 A1 | 3/2019 | Chang et al. | |
| 2019/0103392 A1 | 4/2019 | Chang et al. | |

FOREIGN PATENT DOCUMENTS

| | | |
|---|---|---|
| KR | 1020170015835 A | 2/2017 |
| TW | 200623978 A | 7/2006 |
| TW | 200705810 A | 2/2007 |
| WO | WO 2014070005 A1 | 5/2014 |

OTHER PUBLICATIONS

Grant of Patent, dated Jan. 8, 2021, for Korean Intellectual Property Office Patent Appl. No. 10-2018-0115923, 4 pages.

* cited by examiner

PIN MODIFICATION FOR STANDARD CELLS

CROSS-REFERENCE TO RELATED APPLICATION

This application is a continuation of U.S. Non-provisional patent application Ser. No. 17/315,900, titled "Pin Modification for Standard Cells," filed on May 10, 2021, now U.S. Pat. No. 11,637,098, which is a continuation of U.S. Non-provisional patent application Ser. No. 16/744,975, titled "Pin Modification for Standard Cells," filed on Jan. 16, 2020, now U.S. Pat. No. 11,037,920, which is a continuation of U.S. Non-provisional patent application Ser. No. 15/966,507, titled "Pin Modification for Standard Cells," now U.S. Pat. No. 10,559,558, filed on Apr. 30, 2018, which claims the benefit of U.S. Provisional Patent Application No. 62/565,262, titled "Concave Cut-Based Standard Cell Structure," which was filed on Sep. 29, 2017, all of which are incorporated herein by reference in their entireties.

BACKGROUND

An electronic design automation tool can be used for an integrated circuit design flow. For example, the electronic design automation tool can be used to place standard cells (e.g., cells that implement logic or other electronic functions) in an integrated circuit layout design and route the standard cells to one another. As technology increases and the demand for scaled integrated circuits grow, electronic design automation tools become increasingly important to aid in the design of complex integrated circuit layout designs.

BRIEF DESCRIPTION OF THE DRAWINGS

Aspects of the present disclosure are best understood from the following detailed description when read with the accompanying figures. In the figures, generally, like reference numbers indicate identical or functionally similar elements. Additionally, generally, the left most digit(s) of a reference number identifies the drawing in which the reference number first appears.

DETAILED DESCRIPTION

Figure 1:
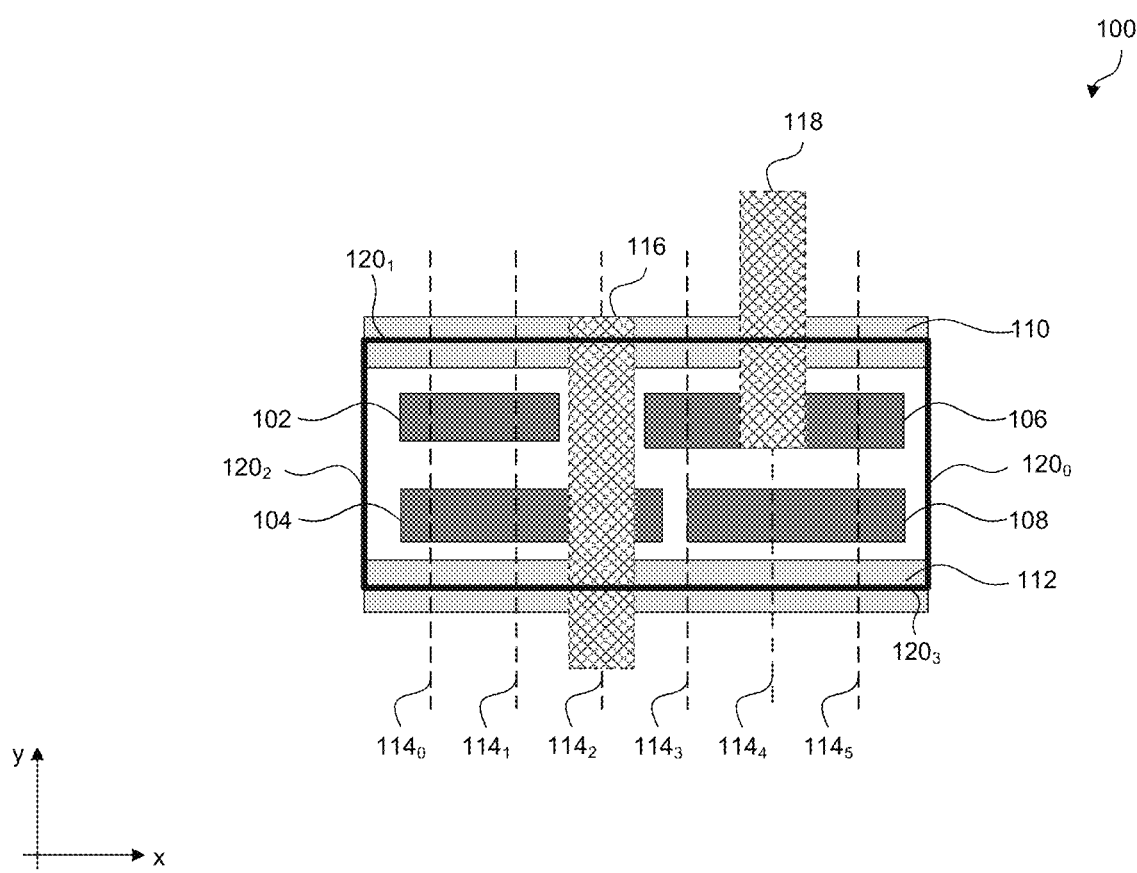
FIG. 1 is an illustration of an example standard cell, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The term "nominal" as used herein refers to a desired, or target, value of a characteristic or parameter for a component or a process operation, set during the design phase of a product or a process, together with a range of values above and/or below the desired value—e.g., 1-20% of the value (e.g., ±1%, ±5% m±10%, ±15%, or ±20% of the value). The range of values can be due to slight variations in manufacturing processes or tolerances.

The present disclosure relates to optimizing interconnect routing in standard cells (e.g., logic modules) placed in an integrated circuit layout design. Embodiments of the present disclosure modify a dimension (e.g., a length dimension) of one or more pins of a standard cell such that a wire cut is not placed—e.g., at a boundary shared by the standard cells—by an electronic design automation tool. The wire cut can serve as a "keep out" area to indicate to an interconnect routing tool (e.g., part of the electronic design automation tool) to avoid routing an interconnect at or near the shared boundary. Without the wire cut placed at the standard cell boundary, additional area in the integrated circuit layout design is available to route interconnects. To meet the demands of increasing the number of interconnects as technology advances and the demand for scaled integrated circuits grow, embodiments of the present disclosure can be used to route interconnects in the integrated circuit layout design.

FIG. 1 is an illustration of an example standard cell 100, according to some embodiments of the present disclosure. Standard cell 100 includes pins 102, 104, 106, and 108, a power pin 110, and a ground pin 112. Standard cell 100 can be a logic module, such as an inverter logic device, a NAND logic device, a NOR logic device, an XNOR logic device, any other logic device, or any combination thereof. Pins 102-108 can be areas in standard cell 100 where one or more inputs or outputs of standard cell 100 can electrically couple to an interconnect. Power pin 110 can be an input that receives a power supply voltage to standard cell 100, such as 0.5 V, 0.7 V, 1.2 V, 1.8 V, 2.4 V, 3.3 V, 5 V, or any other suitable power supply voltage. Ground pin 112 can be an input that receives a ground potential or 0 V to standard cell 100.

In some embodiments of the present disclosure, each of pins 102-108 can be spaced at a predetermined distance from a boundary of standard cell 100. A purpose of the spacing between the pins and the boundaries of standard cell 100 is to prevent an "electrical short" between pins when another standard cell is placed adjacent to standard cell 100. In referring to FIG. 1, right, top, left, and bottom boundaries of standard cell 100 are annotated as $120_0$, $120_1$, $120_2$, and $120_3$, respectively. A spacing between each of pins 102-108 and a boundary of standard cell 100 can be the same (or nominally the same) or different, according to some embodiments of the present disclosure. For example, a spacing (i) between pin 102 and boundary $120_2$, (ii) between pin 104 and boundary $120_2$, (iii) between pin 106 and boundary $120_0$, and (iv) between pin 108 and boundary $120_0$ can be the same (or nominally the same).

In referring to FIG. 1, pin tracks $114_0$-$114_5$ (shown as dashed lines) traverse through standard cell 100, according to some embodiments of the present disclosure. Each of pin tracks $114_0$-$114_5$ can be mapped to (or associated with) a type of interconnect—e.g., a metal M0 interconnect or a metal M1 interconnect—that is used to route one or more pins associated with standards cells. An intersection of pin tracks $114_0$-$114_5$ and each of pins 102-108, power pin 110, and ground pin 112 serve as a pin access point for interconnects to route to the pins of standard cell 100. For example, pin track $114_2$ can be used to map a routing for an interconnect 116 (e.g., metal M0 interconnect or metal M1 interconnect) to power pin 110, and pin track $114_4$ can be used to map a routing for an interconnect 118 (e.g., metal M0 interconnect or metal M1 interconnect) to pin 106. A pitch (or spacing) between neighboring pin tracks—e.g., between pin tracks $114_0$ and $114_1$, pin tracks $114_1$ and $1146_2$, pin tracks $114_2$ and $114_3$, pin tracks $114_3$ and $114_4$, and pin tracks $114_4$ and $114_5$—can be uniform (or nominally uniform), according to some embodiments of the present invention. Though FIG. 1 illustrates pins 102-108, power pin 110, and ground pin 112 of standard cell 100 in a horizontal direction (e.g., x-direction), the pins of standard cell 100 can also be arranged in a vertical direction (e.g., y-direction). Embodiments of the present disclosure are described with respect to pins of standard cells oriented in the horizontal direction, but the description is also applicable to pins of standard cells oriented in the vertical direction.

Figure 2:
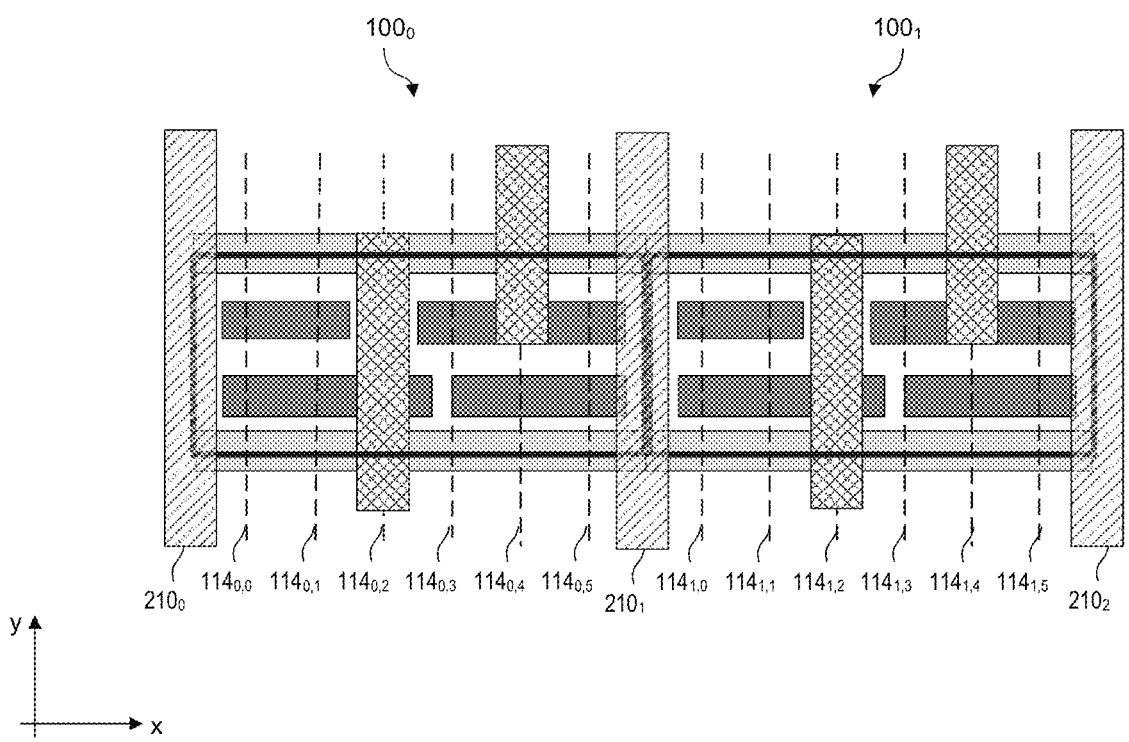
FIG. 2 is an illustration of an example of two standard cells adjacent to one another, according to some embodiments of the present disclosure.

FIG. 2 is an illustration of an example of two standard cells $100_0$ and $100_1$ adjacent to one another, according to some embodiments of the present disclosure. The adjacent standard cells can be the same type of cell with the same logic function or different types of cells with different logic functions. For example purposes, FIG. 2 shows adjacent standard cells $100_0$ and $100_1$ that are the same type of cell with the same logic function. For simplicity purposes, annotations for pins 102-108, power pin 110, ground pin 112, interconnect 116, and interconnect 118 are not shown for standard cells $100_0$ and $100_1$. Annotations for the pin tracks of each standard cell are shown, where for example "$114_{0,4}$" refers to pin track $114_4$ that traverses standard cell $100_0$. To optimize the standard cell placement in an integrated circuit layout design, standard cells $100_0$ and $100_1$ should be placed as close as possible to one another. For example, as shown in FIG. 2, the boundaries of standard cells $100_0$ and $100_1$ can meet to optimize their placement in the integrated circuit layout design.

In referring to FIG. 2, wire cuts $210_0$-$210_2$ can be placed by, for example, an electronic design automation tool along the boundaries of standard cells $100_0$ and $100_1$ (e.g., boundaries $120_{0,2}$, $120_{0,0}$, $120_{1,0}$, and $120_{1,2}$). For example, after placing standard cells $100_0$ and $100_1$ in the integrated circuit layout design, as shown in FIG. 2, the electronic design automation tool can measure a distance between pins that are adjacent to one another, across standard cells $100_0$ and $100_1$. If the pins are within a predetermined distance, the electronic design automation tool can place a wire cut in those areas of the integrated circuit layout design. In some embodiments, the electronic design automation tool assesses the predetermined distances of input/output pins 102-108 and selectively omits assessing the predetermined distances of power pin 110 and ground pin 112. The predetermined distance can based on integrated circuit layout design rules set by a technology node associated with the fabrication of standard cells $100_0$ and $100_1$—e.g., a technology node with a smaller critical dimension can have a smaller predetermined distance than a technology node with a larger critical dimension. The wire cuts can serve as "keep out" areas to indicate to an interconnect routing tool (e.g., part of the electronic design automation tool) to avoid routing an interconnect in those areas. The restriction of routing interconnects in the wire cut areas can prevent potential electrical shorts between adjacent pins across standard cells $100_0$ and $100_1$.

On the other hand, wire cuts $210_0$-$210_2$ restrict interconnect routing on and/or near the boundaries of standard cells $100_0$ and $100_1$. As technology advances and the demand for scaled integrated circuits grow, an increasing number of standard cells are required to fit in smaller integrated circuit layout designs, thus creating challenges for routing interconnects to the standard cells. Interconnect routing restrictions due to wire cuts (e.g., placed by the electronic design automation tool) pose additional challenges when increasing the number of interconnects in the integrated circuit layout design. Embodiments of the present disclosure address, among other things, these interconnect challenges.

According to some embodiments of the present disclosure, one or more pins in the standard cell can be modified or re-shaped. By modifying the pins, the distance between pins, across adjacent standard cells, can be increased. With the increased distance, the electronic design automation tool does not place a wire cut in those areas, thus providing additional area in the integrated circuit layout design to route interconnects.

Figure 3:
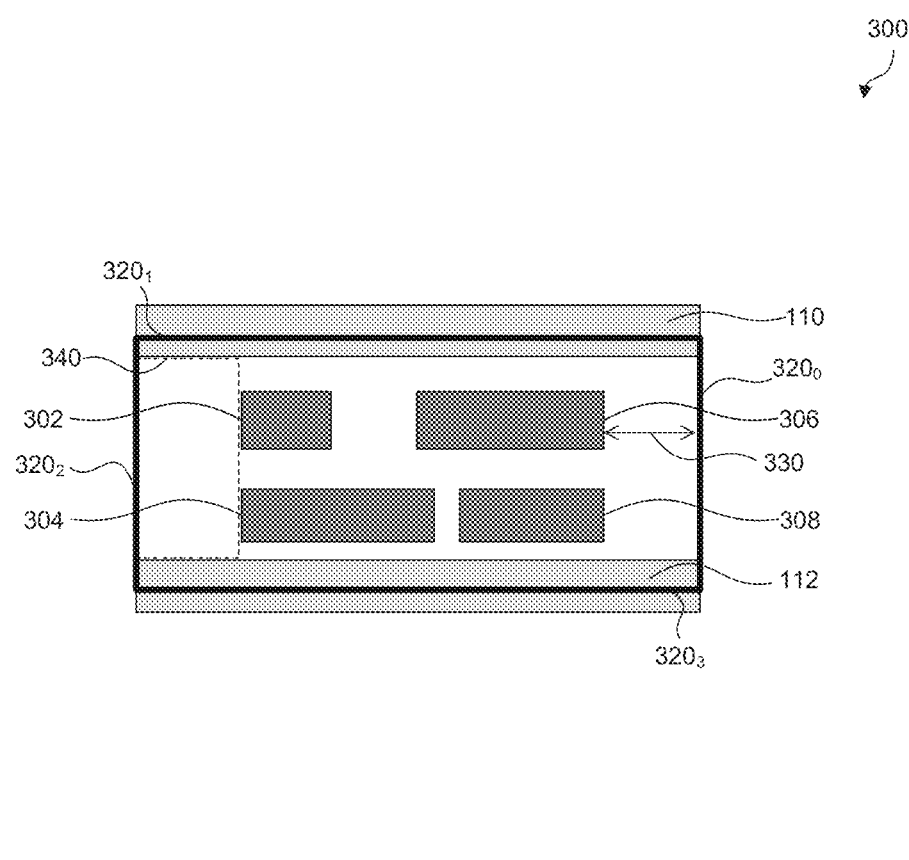
FIG. 3 is an illustration of an example standard cell with modified pins, according to some embodiments of the present disclosure.

FIG. 3 is an illustration of an example standard cell 300 with modified (or re-shaped) pins, according to some embodiments of the present disclosure. Standard cell 300 includes pins 302, 304, 306, and 308, power pin 110, and ground pin 112. Right, top, left, and bottom boundaries of standard cell 300 are annotated as $320_0$, $320_1$, $320_2$, and $320_3$, respectively. For simplicity purposes, pin tracks are not illustrated in FIG. 3.

Pins 302, 304, 306, and 308 are re-shaped versions of pins 102, 104, 106, and 108 of FIG. 1, respectively, according to some embodiments of the present disclosure. In referring to FIG. 1, a length dimension (e.g., a dimension along an x-direction) of pins 102, 104, 106, and 108 can be modified (e.g., shortened) such that each of the pins is spaced at an increased distance from a boundary of standard cell 100. Each of pins 102, 104, 106, and 108 can be modified (e.g., shortened) by a distance such that their distance from respective boundaries $120_0$ and $120_2$ are equal (or nominally equal). Alternatively, one or more of pins 102, 104, 106, and 108 can be shortened by a different distance from another pin such that one or more of the pins' distances from respective boundaries $120_0$ and $120_2$ are different. A result of modifying the dimension of pins 102, 104, 106, and 108 is shown as pins 302, 304, 306, and 308, respectively, in FIG. 3. For example purposes, FIG. 3 shows pins 302, 304, 306, and 308 modified (e.g., shortened) by a distance such that the pins' distance from respective boundaries $320_0$ and $320_2$ are equal (or nominally equal).

In some embodiments of the present disclosure, a minimum distance 330 that pins 302, 304, 306, and 308 can be spaced from respective boundaries $320_0$ and $320_2$ can be based on (i) a width dimension of a wire cut ($W_{cut}$), (ii) a width dimension of a via ($W_{via}$), and (iii) a minimum distance requirement between an interconnect (e.g., a metal M0 interconnect or a metal M1 interconnect) and the via (Dunn). Minimum distance 330 can be defined by the following equation, according to some embodiments of the present disclosure:

Minimum Distance 330=$W_{cut}$+[½·$W_{via}$]+$D_{min}$.

Values for $W_{cut}$, $W_{via}$, and $D_{min}$ can be based on a particular technology node associated with the fabrication of standard cell 300. With pins 302, 304, 306, and 308 spaced from their respective boundaries $320_0$ and $320_2$ by at least minimum distance 330, the electronic design automation tool does not place a wire cut in the integrated circuit layout design near these areas, according to some embodiments of the present invention. If the spacing is less than minimum distance 330, the electronic design automation tool can place one or more wire cuts near these areas.

As shown in FIG. 3, pins 302, 304, 306, and 308 are modified (e.g., shortened) along their length dimensions (e.g., in the x-direction). In some embodiments of the present disclosure, power pin 110 and ground pin 112 are not modified as the spacing between these types of pins may not trigger the electronic design automation tool to place a wire cut in the integrated circuit layout design in these areas. The shape or contour 340 formed by pins 302, 304, 306, and 308, power pin 110, and ground pin 112 (shown by a dashed line in FIG. 3) can be concave, according to some embodiments of the present disclosure.

Figure 4:
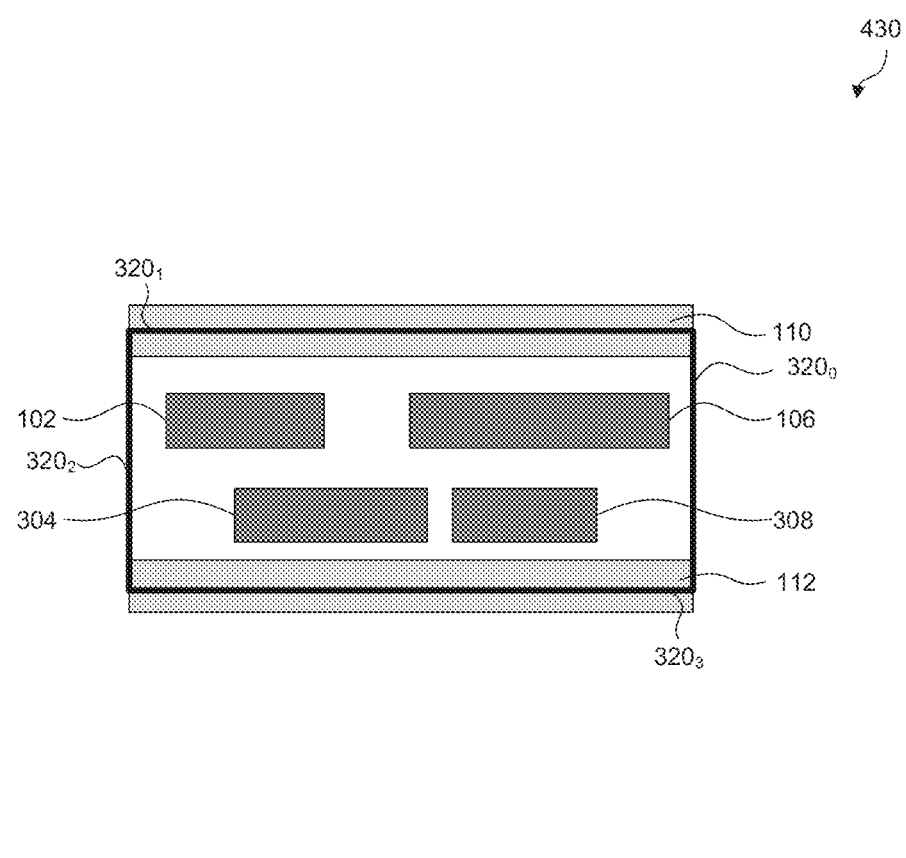
FIG. 4 is an illustration of an example standard cell with modified pins, according to some embodiments of the present disclosure.

Other shapes and contours can be formed by modifying the pins of the standard cell based on, for example, minimum distance 330. For example, relative to the pin arrangement shown in FIG. 3, FIG. 4 shows pins 102 and 106, which are extended representations of pins 302 and 306 of FIG. 3. Pins 102 and 106 are described above with respect to FIG. 1. With this pin arrangement, the electronic design automation tool may not assess the predetermined distances of pins 102 and 106 from boundaries $320_2$ and $320_0$, respectively, such that a wire cut may be needed due to the spacing of these pins. Based on the description herein, a person of ordinary skill in the art will recognize that other pin arrangements are possible. These other pin arrangements are within the spirit and scope of the present disclosure.

Figure 5A:
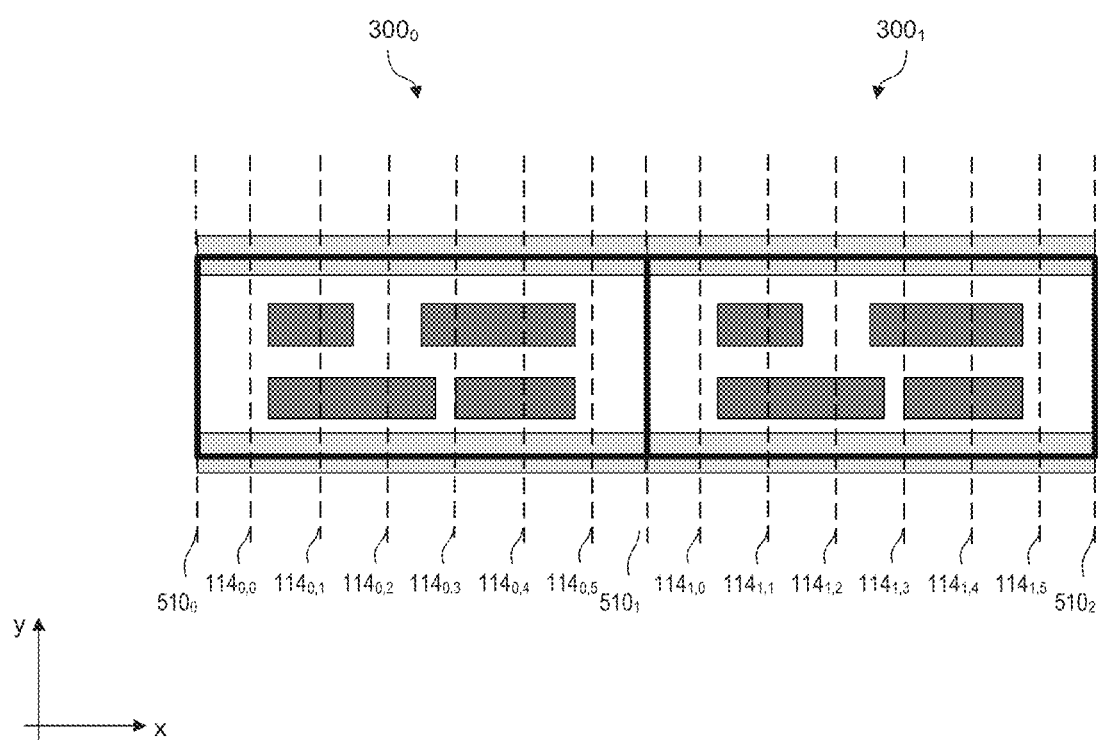
FIGS. 5A and 5B are illustrations of example integrated circuit layout designs, each with two standard cells adjacent to one another with pin tracks along boundaries of the standard cells, according to some embodiments of the present disclosure.
Figure 5B:
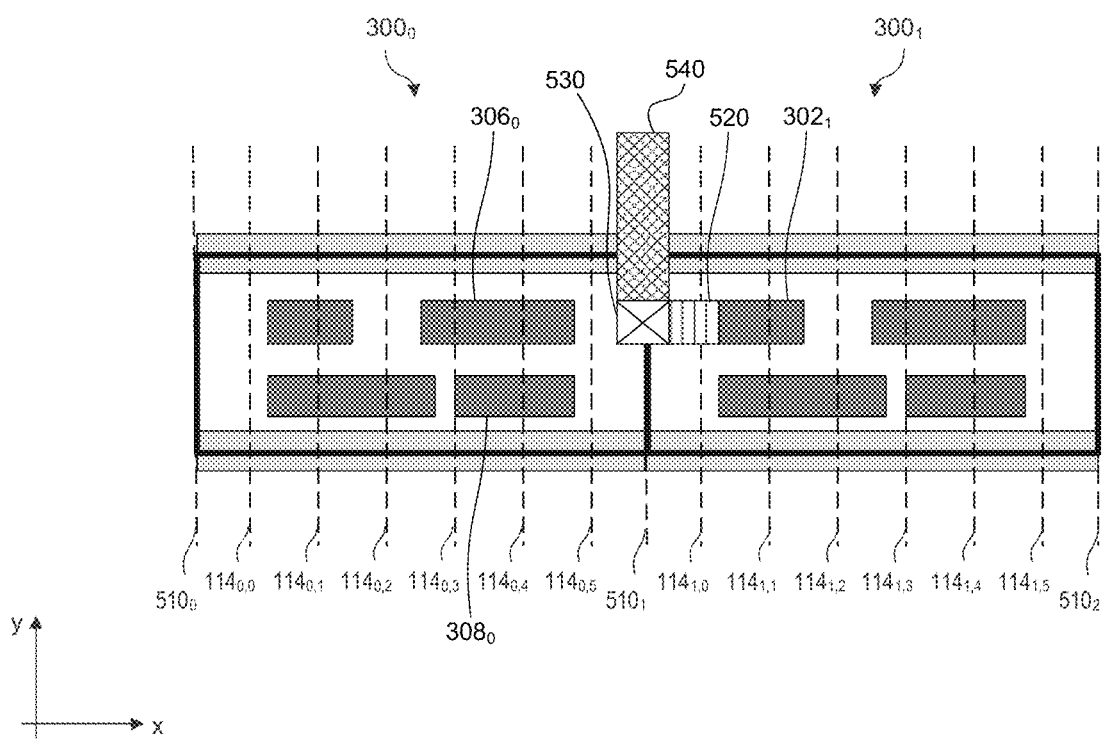

FIGS. 5A and 5B are illustrations of example integrated circuit layout designs, each with two standard cells $300_0$ and $300_1$ adjacent to one another with pin tracks along boundaries of the standard cells, according to some embodiments of the present disclosure. The adjacent standard cells can be the same type of cell with the same logic function or different types of cells with different logic functions. For example purposes, FIGS. 5A and 5B show adjacent standard cells $300_0$ and $300_1$ that are the same type of cell with the same logic function. For simplicity purposes, some or all annotations for pins 302-308, power pin 110, and ground pin 112 are not shown for standard cells $300_0$ and $300_1$. As shown in FIGS. 5A and 5B, the boundaries of standard cells $300_0$ and $300_1$ can meet to optimize their placement in the integrated circuit layout design.

FIG. 5A shows pin tracks $114_{0,0}$-$114_{0,5}$ and pin tracks $114_{1,0}$-$114_{1,5}$ (described above with respect to FIG. 2) and pin tracks $510_0$-$510_2$, according to some embodiments of the present disclosure. Since pins 302-308 in standard cells $300_0$ and $300_1$ (which are not annotated in FIG. 5A) are spaced at a minimum distance from the standard cell boundaries—e.g., by at least a minimum distance 330 of FIG. 3—wire cuts are not placed at the boundaries of standard cells $300_0$ and $300_1$ by an electronic design automation tool. Without the placement of wire cuts in these areas of the integrated circuit layout design, pin tracks $510_0$-$510_2$ can be used to map (or associate) a type of interconnect—e.g., a metal M0 interconnect or a metal M1 interconnect—along the boundaries of standard cells $300_0$ and $300_1$.

FIG. 5A shows the placement of pin tracks $510_0$-$510_2$ on the boundaries of standard cells $300_0$ and $300_1$, according to some embodiments of the present disclosure. Based on the description herein, a person of ordinary skill in the art will recognize that pin tracks $510_0$-$510_2$ can be mapped to other portions of the standard cells—e.g., within the boundaries of standard cells $300_0$ and $300_1$. These other pin track locations are within the spirit and scope of the present disclosure. If mapped to these other pin track locations, one or more pins of the standard cells (e.g., pins 302-308) may need to be spaced at minimum distance 330 from the pin track locations.

FIG. 5B shows an example routing of an interconnect along pin track $510_1$ that traverses a shared boundary of standard cells $300_0$ and $300_1$, according to some embodiments of the present disclosure. In this example, pin $302_1$ in standard cell $300_1$ can be electrically coupled to a first interconnect 520, which can be, for example, a metal M0 interconnect. First interconnect 520 can be routed to pin track $510_1$, which is located along a shared boundary of standard cells $300_0$ and $300_1$. Along pin track $510_1$, first interconnect 520 can be electrically coupled to a second interconnect 540 through a via (and contact) 530. Via 530 can be placed on pin track $510_1$. Second interconnect 540 can be routed along pin track $510_1$ and can be, for example, a metal M1 interconnect. The interconnect structure formed by first interconnect 520, via 530, and second interconnect 540 can be routed along other pin tracks, such as pin track $114_{0,5}$ in standard cell $300_0$, according to some embodiments of the present disclosure.

In some embodiments of the present disclosure, after standard cells $300_0$ and $300_1$ have been placed in the integrated circuit layout design and after first interconnect 520 and second interconnect 540 have been routed, one or more wire cuts can be inserted in the integrated circuit layout design by, for example, an electronic automation design tool. As discussed above, a purpose of the wire cut is to serve as a "keep out" area to indicate to an interconnect routing tool (e.g., as part of the electronic design automation tool) to avoid routing an interconnect in that area. By restricting an interconnect routing outside the wire cut area, potential electrical shorts can be prevented between the interconnect structure (e.g., the interconnect structure formed by first interconnect 520, via 530, and second interconnect 540) and an adjacent pin (e.g., pin $306_0$ of standard cell $300_0$). For example, in referring to FIG. 5B, a wire cut (not shown) can be inserted between pin $306_0$ and the interconnect structure formed by first interconnect 520, via 530, and second interconnect 540.

After the wire cut is placed, the electronic design automation tool can verify that the wire cut separates the pin from the interconnect structure by a predetermined distance. In some embodiments of the present disclosure, the predetermined distance can be minimum distance 330 of FIG. 3. In referring to FIG. 5B, pin $306_0$ in standard cell $300_0$ can be spaced from via 530 by a minimum distance that takes into account (i) a width dimension of a wire cut ($W_{cut}$), (ii) a width dimension of via 530 ($W_{via}$), and (iii) a minimum distance requirement between an interconnect that would be routed to pin $306_0$ in standard cell $300_0$ and via 530 ($D_{min}$). An example of this minimum distance is described above with respect to minimum distance 330 of FIG. 3. In some embodiments of the present disclosure, if the minimum distance is not met, the electronic design automation tool can (i) modify a dimension (e.g., length dimension along an x-axis) of one or more pins in standard cell $300_0$ (e.g., pins $306_0$ and $308_0$) such that the minimum distance is met, (ii) re-route the interconnect structure formed by first interconnect 520, via 530, and second interconnect 540 such that the minimum distance is met, or (iii) a combination thereof.

According to some embodiments of the present disclosure, the modified (or re-shaped) pins in standard cells $300_0$ and $300_1$ can increase the number of interconnects in the integrated circuit layout design. For example, the modified pins can increase a distance between pins across adjacent standard cells. With the increased distance, the electronic design automation tool does not place a wire cut in those areas, thus providing additional area in the integrated circuit layout design to route interconnects. As technology advances and the demand for scaled integrated circuits grow, an increasing number of interconnects are required to be routed in smaller integrated circuit layout designs. To meet the demand, embodiments of the present disclosure can be used to route interconnects in the integrated circuit layout design.

Figure 6:
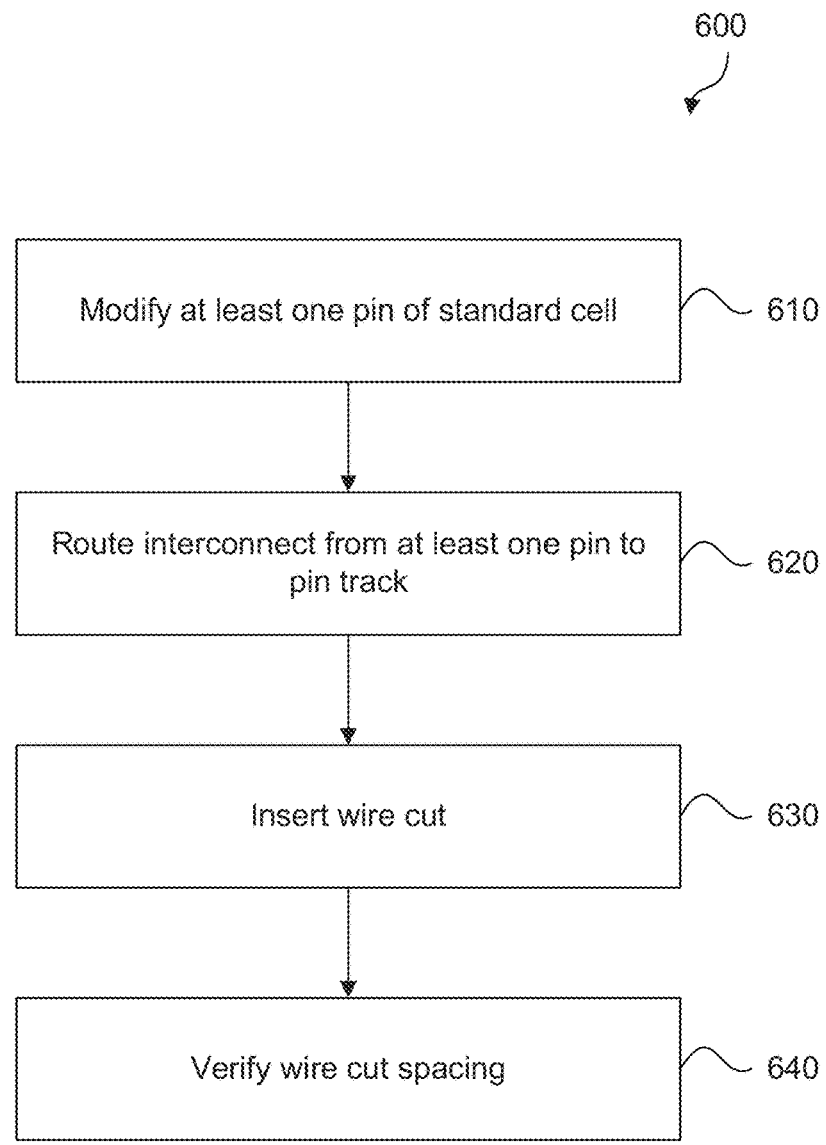
FIG. 6 is an illustration of an example method for re-shaping one or more pins of a standard cell and routing an interconnect to the one or more pins, according to some embodiments of the present disclosure.

FIG. 6 is an illustration of an example method 600 for modifying one or more pins of a standard cell and routing an interconnect to the one or more pins, according to some embodiments of the present disclosure. The operations depicted in method 600 can be performed by, for example, an electronic design automation tool that operates on a computer system, such as an example computer system 700 described below with respect to FIG. 7. It is to be appreciated that not all operations described below may be needed to perform the disclosure provided herein and that one or more additional operations may be performed. Further, some of the operations may be performed concurrently or in a different order than shown in FIG. 6.

In operation 610, a dimension of at least one pin from a plurality of pins of a standard cell is modified. In some embodiments of the present disclosure, the at least one pin is spaced at an increased distance from a boundary of the standard cell than an original position of the at least one pin. For example, in referring to FIG. 1, pin 106 is at an original position relative to boundary $120_0$ of standard cell 100. A dimension of pin 106 (e.g., a length dimension along the x-axis) can be modified (e.g., shortened) such that pin 106 is spaced at an increased distance from boundary $120_0$. A result of modifying the dimension of pin 106 is shown as pin 306 of FIG. 3. In FIG. 3, pin 306 is spaced at an increased distance from boundary $320_0$ relative to the distance of pin 106 from boundary $120_0$ in FIG. 1. In some embodiments of the present disclosure, the distance between pin 306 and boundary $320_0$ can be minimum distance 330 of FIG. 3. As described above, minimum distance 330 can be based on (i) a width dimension of a wire cut ($W_{cut}$), (ii) a width dimension of a via ($W_{via}$), and (iii) a minimum distance requirement between an interconnect (e.g., a metal M0 interconnect or a metal M1 interconnect) and the via ($D_{min}$). Minimum distance 330 can be defined by the following equation, according to some embodiments of the present disclosure:

Minimum Distance $330 = W_{cut} + [\frac{1}{2} \cdot W_{via}] + D_{min}$.

Values for $W_{cut}$, $W_{via}$, and $D_{min}$, can be based on a particular technology node associated with the fabrication of standard cell 300. As shown in the example pin arrangement of FIG. 3, dimensions of other pins in standard cell 300 (e.g., pins 304-308) can be modified such that these pins are spaced from their respective boundaries $320_0$ and $320_2$ at the same distance as pin 302 is spaced from boundary $320_0$.

Further, the pins in standard cell 300 can be modified to form different pin arrangements. For example, in FIG. 3, standard cell 300 includes a power pin 110 in an upper portion of the standard cell, pins 302-308 in a middle portion of the standard cell, and a ground pin 112 in a lower portion of the standard cell. In this pin arrangement, the dimensions of power pin 110 and ground pin 112 are not modified and the dimensions of pins 302-308 are modified (e.g., length dimensions of these pins are shortened), thus forming a concave-shaped contour 340. Another example pin arrangement is shown in FIG. 4. Based on the description herein, a person of ordinary skill in the art will recognize that other pin arrangements are possible. These other pin arrangements are within the spirit and scope of the present disclosure.

In operation 620, an interconnect is routed from the at least one pin to a via placed on a pin track located between the at least one pin and the boundary. For example, in referring to FIG. 5B, a first interconnect 520 is routed from pin $302_1$ in standard cell $300_1$ to via 530. Via 530 can be placed, for example, on pin track $510_1$. Further, a second interconnect 540 is routed along pin track $510_1$. The interconnect structure formed by first interconnect 520, via 530, and second interconnect 530 can be routed along other pin tracks, such as pin track $114_{0,5}$ in standard cell $300_0$ (which is located outside of standard cell $300_1$), according to some embodiments of the present disclosure.

In operation 630, a wire cut is inserted between the interconnect and at least one pin from an adjacent standard cell. For example, in referring to FIG. 5B, a wire cut can be inserted between pin $306_0$ and the interconnect structure formed by first interconnect 520, via 530, and second interconnect 540. The wire cut can be inserted by, for example, an electronic design automation tool.

In operation 640, the wire cut is verified whether it separates the interconnect from the at least one pin from the adjacent standard cell by at least a predetermined distance. In some embodiments of the present disclosure, the predetermined distance can be minimum distance 330 of FIG. 3. In referring to FIG. 5B, if the minimum distance is not met, the electronic design automation tool can (i) modify a dimension (e.g., length dimension along an x-axis) of one or more pins in standard cell $300_0$ (e.g., pins $306_0$ and $308_0$) such that the minimum distance is met, (ii) re-route the interconnect structure formed by first interconnect 520, via 530, and second interconnect 540 such that the minimum distance is met, or (iii) a combination thereof, according to some embodiments of the present disclosure.

Figure 7:
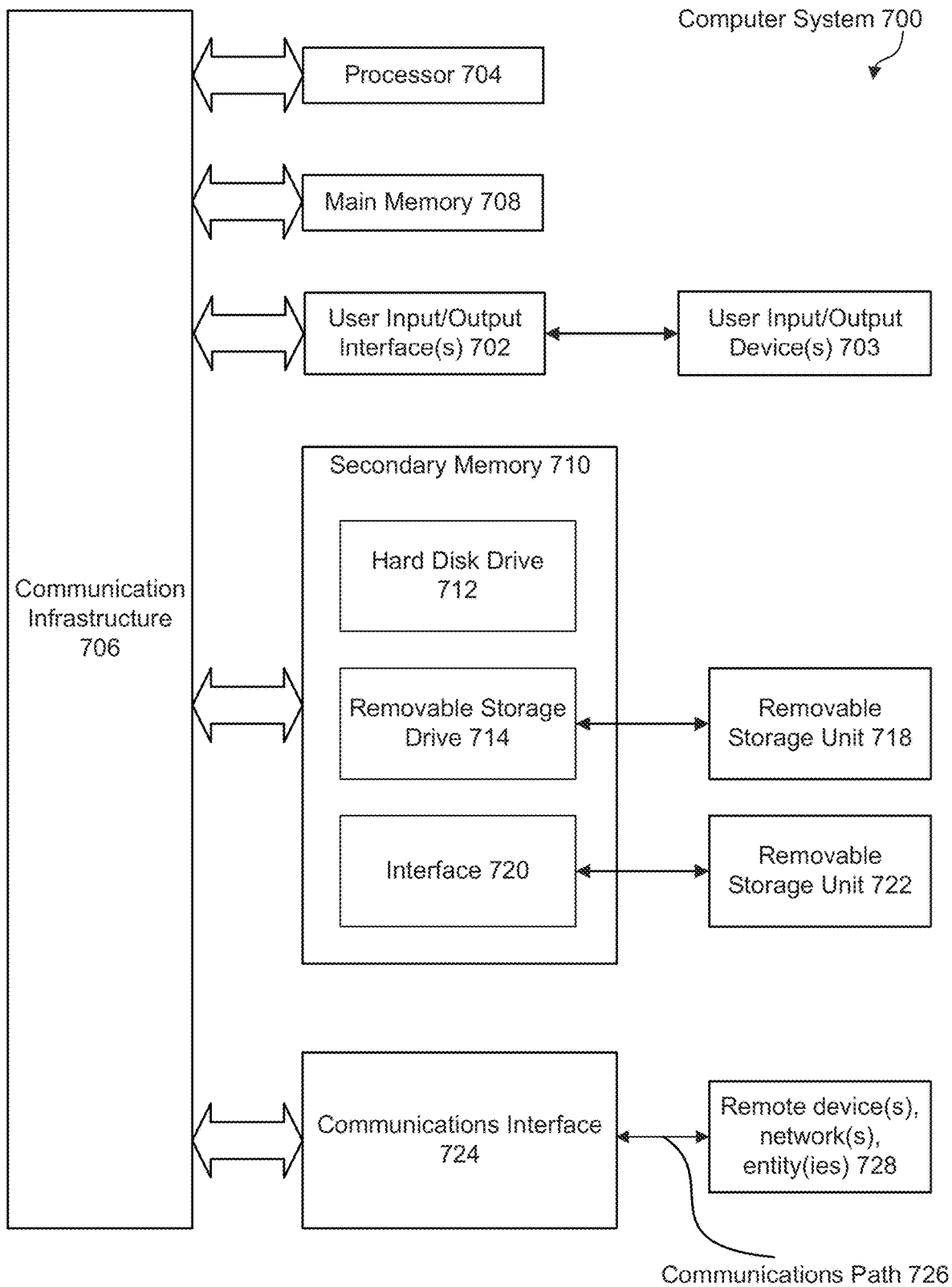
FIG. 7 is an illustration of an example computer system in which various embodiments of the present disclosure can be implemented, according to some embodiments of the present disclosure.

FIG. 7 is an illustration of an example computer system 700 in which various embodiments of the present disclosure can be implemented, according to some embodiments. Computer system 700 can be any well-known computer capable of performing the functions and operations described herein. For example, and without limitation, computer system 700 can be capable of (i) placing standard cells in an integrated circuit layout design using, for example, an electronic design automation tool and (ii) routing one or more interconnects to the standard cells. Computer system 700 can be used, for example, to execute one or more operations in method 600, which describes an example method for re-shaping one or more pins of a standard cell and routing an interconnect to the one or more pins, according to some embodiments of the present disclosure.

Computer system 700 includes one or more processors (also called central processing units, or CPUs), such as a processor 704. Processor 704 is connected to a communication infrastructure or bus 706. Computer system 700 also includes input/output device(s) 703, such as monitors, keyboards, pointing devices, etc., that communicate with communication infrastructure or bus 706 through input/output interface(s) 702. An electronic design automation tool can receive instructions to implement functions and operations described herein—e.g., method 600 of FIG. 6—via input/output device(s) 703. Computer system 700 also includes a main or primary memory 708, such as random access memory (RAM). Main memory 708 can include one or more levels of cache. Main memory 708 has stored therein control logic (e.g., computer software) and/or data. In some embodiments of the present disclosure, the control logic (e.g., computer software) and/or data can include one or more of the operations described above with respect to method 600 of FIG. 6.

Computer system 700 can also include one or more secondary storage devices or memory 710. Secondary memory 710 can include, for example, a hard disk drive 712 and/or a removable storage device or drive 714. Removable storage drive 714 can be a floppy disk drive, a magnetic tape drive, a compact disk drive, an optical storage device, tape backup device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, and/any other computer data storage device. Removable storage drive 714 reads from and/or writes to removable storage unit 718 in a well-known manner.

According to some embodiments of the present disclosure, secondary memory 710 can include other means, instrumentalities or other approaches for allowing computer programs and/or other instructions and/or data to be accessed by computer system 700. Such means, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments of the present disclosure, secondary memory 710, removable storage unit 718, and/or removable storage unit 722 can include one or more of the operations described above with respect to method 600 of FIG. 6.

Computer system 700 can further include a communication or network interface 724. Communication interface 724 enables computer system 700 to communicate and interact with any combination of remote devices, remote networks, remote entities, etc. (individually and collectively referenced by reference number 728). For example, communication interface 724 can allow computer system 700 to communicate with remote devices 728 over communications path 726, which can be wired and/or wireless, and which can include any combination of LANs, WANs, the Internet, etc. Control logic and/or data can be transmitted to and from computer system 700 via communication path 726.

The operations in the embodiments of the present disclosure can be implemented in a wide variety of configurations and architectures. Therefore, some or all of the operations in the embodiments of the present disclosure—e.g., method 600 of FIG. 6 and method 800 of FIG. 8 (described below)—can be performed in hardware, in software or both. In some embodiments of the present disclosure, a tangible apparatus or article of manufacture comprising a tangible computer useable or readable medium having control logic (software) stored thereon is also referred to herein as a computer program product or program storage device. This includes, but is not limited to, computer system 700, main memory 708, secondary memory 710 and removable storage units 718 and 722, as well as tangible articles of manufacture embodying any combination of the foregoing. Such control logic, when executed by one or more data processing devices (such as computer system 700), causes such data processing devices to operate as described herein.

Figure 8:
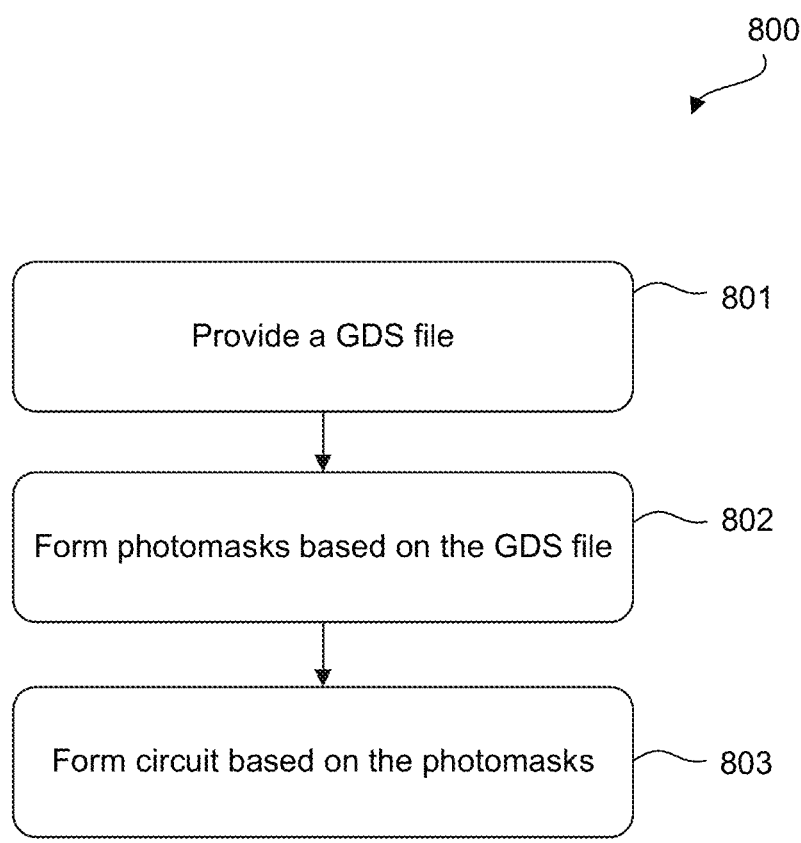
FIG. 8 is an illustration of a process to form standard cell structures based on a graphic database system (GDS) file, according to some embodiments.

FIG. 8 is an illustration of an exemplary method 800 for circuit fabrication, according to some embodiments. Operations of method 800 can also be performed in a different order and/or vary. Variations of method 800 should also be within the scope of the present disclosure.

In operation 800, a GDS file is provided. The GDS file can be generated by an EDA tool and contain the standard cell structures that have already been optimized using the disclosed method. The operation depicted in 801 can be performed by, for example, an EDA tool that operates on a computer system, such as computer system 700 described above.

In operation 802, photomasks are formed based on the GDS file. In some embodiments, the GDS file provided in operation 801 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 802 can be performed by a photomask manufacturer, where the circuit layout is read using a suitable software (e.g., EDA tool) and the circuit layout is transferred onto a substrate using a suitable printing/deposition tool. The photomasks reflect the circuit layout/features included in the GDS file.

In operation 803, one or more circuits are formed based on the photomasks generated in operation 802. In some embodiments, the photomasks are used to form patterns/structures of the circuit contained in the GDS file (e.g., standard cell placement and interconnect routings described above with respect to FIGS. 3-6). In some embodiments, various fabrication tools (e.g., photolithography equipment, deposition equipment, and etching equipment) are used to form features of the one or more circuits.

The present disclosure relates to optimizing interconnect routing in standard cells placed in an integrated circuit layout design. Embodiments of the present disclosure modify or re-shape a dimension (e.g., a length dimension) of one or more pins of a standard cell such that a wire cut is not placed—e.g., at a boundary shared by standard cells—by an electronic design automation tool. Without the wire cut placed at the standard cell boundary, additional area in the integrated circuit layout design is available to route interconnects. To meet the demands of increasing the number of interconnects as technology advances and the demand for scaled integrated circuits grow, embodiments of the present disclosure can be used to route interconnects in the integrated circuit layout design.

Embodiments of the present disclosure describe a method for routing a standard cell with multiple pins. The method can include modifying a dimension of a pin from the multiple pins, where the pin is spaced at an increased distance from a boundary of the standard cell than an original position of the pin. The method also includes routing an interconnect from the pin to a via placed on a pin track located between the pin and the boundary and inserting a wire cut between the interconnect and a pin from an adjacent standard cell. The method further includes verifying that the wire cut separates the interconnect from the pin from the adjacent standard cell by at least a predetermined distance.

Embodiments of the present disclosure describe a system with a memory and a processor. The memory is configured to store instructions. When executing the instructions, the processor is configured to perform operations for routing a standard cell with multiple pins. The operations include modifying a dimension of a pin from the multiple pins, where the pin is spaced at an increased distance from a boundary of the standard cell than an original position of the pin. The operations also include routing an interconnect from the pin to a via placed on a pin track located between the pin and the boundary and inserting a wire cut between the interconnect and a pin from an adjacent standard cell. The operations further include verifying that the wire cut separates the interconnect from the pin from the adjacent standard cell by at least a predetermined distance.

Embodiments of the present disclosure describe a non-transitory computer-readable medium having instructions stored thereon that, when executed by a computing device, causes the computing device to perform operations. The operations include modifying a dimension of a pin from the multiple pins, where the pin is spaced at an increased distance from a boundary of the standard cell than an original position of the pin. The operations also include routing an interconnect from the pin to a via placed on a pin track located between the pin and the boundary and inserting a wire cut between the interconnect and a pin from an adjacent standard cell. The operations further include verifying that the wire cut separates the interconnect from the pin from the adjacent standard cell by at least a predetermined distance.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method comprising:
   routing a first interconnect to a pin track adjacent to a boundary between first and second standard cells, wherein a first pin in the first standard cell is electrically coupled to the first interconnect;
   routing a second interconnect along the pin track, wherein the second interconnect is electrically coupled to the first interconnect through a via;
   inserting a spacing between the second interconnect and a second pin in the second standard cell, wherein the second pin is adjacent to the boundary;
   determining a preliminary distance between the second pin and the boundary; and
   in response to the preliminary distance being less than a predetermined distance, modifying a dimension of the second pin such that the second pin is spaced from the boundary at a greater distance than the preliminary distance.

2. The method of claim 1, further comprising:
   placing the first pin in a middle portion of the first standard cell;
   placing a third pin in an upper portion of the first standard cell; and
   placing a fourth pin in a lower portion of the first standard cell.

3. The method of claim 2, wherein the third and fourth pins are placed closer to the boundary than the first pin to the boundary.

4. The method of claim 1, wherein modifying the dimension of the second pin comprises reducing a length of the second pin.

5. The method of claim 1, wherein modifying the dimension of the second pin comprises placing the second pin at a minimum distance from the boundary, and wherein the minimum distance is based on at least one of (i) a width dimension of the spacing, (ii) one-half of a width dimension of the via, and (iii) a minimum distance requirement between the first interconnect and the via.

6. The method of claim 1, wherein routing the first interconnect comprises routing the first interconnect from the first pin to the via placed on the pin track, wherein the pin track extends along the boundary.

7. The method of claim 1, wherein routing the first interconnect comprises routing the first interconnect from the first pin to the via placed on the pin track, wherein the pin track is located outside of the first standard cell.

8. The method of claim 1, wherein in response to the preliminary distance being less than the predetermined distance, the method further comprises re-routing the via, the first interconnect, and the second interconnect.

9. A computer system comprising:
   a memory configured to store instructions; and
   a processor, that when executing the instructions, is configured to perform operations for routing one or more standard cells with a plurality of pins, the operations comprising:
   routing a first interconnect to a pin track adjacent to a boundary between first and second standard cells, wherein a first pin in the first standard cell is electrically coupled to the first interconnect;
   routing a second interconnect along the pin track, wherein the second interconnect is electrically coupled to the first interconnect through a via;
   inserting a spacing between the second interconnect and a second pin in the second standard cell, wherein the second pin is adjacent to the boundary;
   determining a preliminary distance between the second pin and the boundary; and
   in response to the preliminary distance being less than a predetermined distance, modifying a dimension of the second pin such that the second pin is spaced from the boundary at a greater distance than the preliminary distance.

10. The computer system of claim 9, wherein modifying the dimension of the second pin comprises reducing a length of the second pin.

11. The computer system of claim 9, wherein modifying the dimension of the second pin comprises placing the second pin at a minimum distance from the boundary, and wherein the minimum distance is based on at least one of (i) a width dimension of the spacing, (ii) one-half of a width dimension of the via, and (iii) a minimum distance requirement between the first interconnect and the via.

12. The computer system of claim 9, wherein routing the first interconnect comprises routing the first interconnect from the first pin to the via placed on the pin track, wherein the pin track extends along the boundary.

13. The computer system of claim 9, wherein routing the first interconnect comprises routing the first interconnect from the first pin to the via placed on the pin track, wherein the pin track is located outside of the first standard cell.

14. The computer system of claim 9, wherein in response to the preliminary distance being less than the predetermined distance, the operations further comprise re-routing the via, the first interconnect, and the second interconnect.

15. A non-transitory computer-readable medium having instructions stored thereon that, when executed by a computing device, cause the computing device to perform operations comprising:
routing a first interconnect to a pin track adjacent to a boundary between first and second standard cells, wherein a first pin in the first standard cell is electrically coupled to the first interconnect;
routing a second interconnect along the pin track, wherein the second interconnect is electrically coupled to the first interconnect through a via;
inserting a spacing between the second interconnect and a second pin in the second standard cell, wherein the second pin is adjacent to the boundary;
determining a preliminary distance between the second pin and the boundary; and
in response to the preliminary distance being less than a predetermined distance, modifying a dimension of the second pin such that the second pin is spaced from the boundary at a greater distance than the preliminary distance.

16. The non-transitory computer-readable medium of claim 15, wherein modifying the dimension of the second pin comprises reducing a length of the second pin.

17. The non-transitory computer-readable medium of claim 15, wherein modifying the dimension of the second pin comprises placing the second pin at a minimum distance from the boundary, and wherein the minimum distance is based on at least one of (i) a width dimension of the spacing, (ii) one-half of a width dimension of the via, and (iii) a minimum distance requirement between the first interconnect and the via.

18. The non-transitory computer-readable medium of claim 15, wherein routing the first interconnect comprises routing the first interconnect from the first pin to the via placed on the pin track, wherein the pin track extends along the boundary.

19. The non-transitory computer-readable medium of claim 15, wherein routing the first interconnect comprises routing the first interconnect from the first pin to the via placed on the pin track, wherein the pin track is located outside of the first standard cell.

20. The non-transitory computer-readable medium of claim 15, wherein in response to the preliminary distance being less than the predetermined distance, the operations further comprise re-routing the via, the first interconnect, and the second interconnect.

* * * * *